United States Patent
Pascucci

[19]

[11] Patent Number: 5,886,945
[45] Date of Patent: Mar. 23, 1999

[54] CIRCUIT AND METHOD TO ADJUST MEMORY TIMING

[75] Inventor: Luigi Pascucci, Sesto San Giovanni, Italy

[73] Assignee: SGS-Thomson Microelectronics, S.r.l., Agrate, Italy

[21] Appl. No.: 825,138

[22] Filed: Mar. 28, 1997

[30] Foreign Application Priority Data

Mar. 29, 1996 [EP] European Pat. Off. .............. 96830176

[51] Int. Cl.⁶ ..................................................... G11C 8/10
[52] U.S. Cl. .......................................... 365/233; 365/205
[58] Field of Search ............................. 365/233, 189.01, 365/205; 327/57

[56] References Cited

U.S. PATENT DOCUMENTS

| | | | |
|---|---|---|---|
| 4,425,633 | 1/1984 | Swain | 365/194 |
| 4,575,812 | 3/1986 | Fitzpatrick | 365/184 |
| 4,687,951 | 8/1987 | McElroy | 307/269 |
| 5,303,188 | 4/1994 | Kohno | 365/189.05 |
| 5,452,311 | 9/1995 | Wells et al. | 371/51.1 |
| 5,608,687 | 3/1997 | Komared et al. | 365/233.5 |

FOREIGN PATENT DOCUMENTS 0 678 873 A1  10/1995  European Pat. Off. .

*Primary Examiner*—David Nelms
*Assistant Examiner*—Hoai V. Ho
*Attorney, Agent, or Firm*—David V. Carlson; Kevin S. Ross; Seed and Berry LLP

[57] ABSTRACT

The circuit includes a memory element connected to an enabling input receiving an enabling signal, and in turn including a first reset circuit receiving an internal reset signal, and a second reset circuit receiving an external timing control signal, to generate an operating step enabling signal having a first switching edge on receiving the enabling signal, a second switching edge on receiving the reset signal, and a third switching edge on receiving the external timing control signal. A control input receives a timing mode signal, and is connected to the first and second reset circuits to enable them selectively. By enabling the second reset circuit and supplying the external timing control signal, in successive cycles, with different delays in relation to the enabling signal, different readings of the memory are enabled to characterize the response and optimize the timing of the memory device.

15 Claims, 2 Drawing Sheets

CIRCUIT AND METHOD TO ADJUST MEMORY TIMING

TECHNICAL FIELD

The present invention relates to a timing characterization circuit and method for memory devices.

BACKGROUND OF THE INVENTION

As is known, the timing of the reading of a memory (e.g., a nonvolatile memory such as an EPROM, to which reference is made herein by way of example) is often linked to basic time events such as the propagation or precharge intervals of basic lines (e.g., word lines, bit lines, redundancy) and the instant in which the data item in a given memory location is evaluated.

As such events are not independent and cannot always be optimized at the design stage, solutions are required capable of characterizing each structure and subsequently modifying timing according to existing conditions.

SUMMARY OF THE INVENTION

It is an object of the present invention to provide a timing characterization circuit and method for characterizing the timing structure of a memory device and for optimizing and defining the limits of the timing system.

The present invention provides a timing characterization circuit, a memory device, and a timing characterization method.

A first mode of the invention is the automatic termination of reading a memory cell a predetermined time period after the beginning of the memory read. The termination in the memory read is caused by a signal generated within the memory device.

A second mode of operation of the invention is the acceptance of a signal generated off the chip which also signals the termination of the memory read of the cell. The circuitry which accepts this externally generated signal can also disable the effect of the internally generated signal. The externally generated termination signal is received at an input node. The signal which disables the internally generated termination signal and enable the externally generated termination signal is received at a second input node.

Another feature of the invention is the inclusion of a memory element in the characterization circuit attached to the memory array. This memory element stores a signal indicating whether the memory array is currently being accessed or currently being terminated.

BRIEF DESCRIPTION OF THE DRAWINGS

A preferred, non-limiting embodiment of the present invention will be described by way of example with reference to the accompanying drawings.

DETAILED DESCRIPTION OF THE INVENTION

Figure 1:
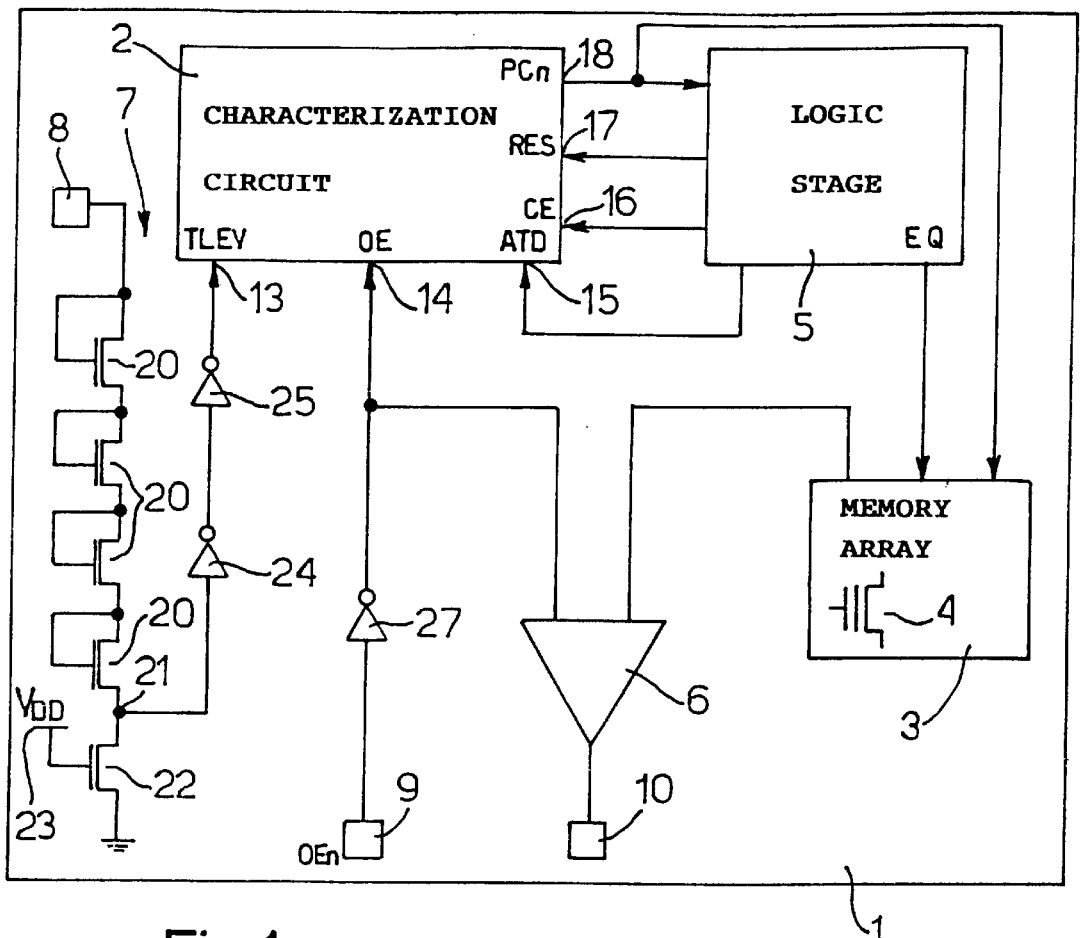
FIG. 1 shows a basic diagram of a memory device in accordance with the present invention.

In FIG. 1, a memory device is indicated as a whole by 1, and comprises a nonvolatile memory, such as an EPROM, of which are shown only the parts pertinent to the present invention.

Memory device 1 comprises a timing characterization circuit 2; a memory array 3 including a number of memory cells 4; a logic stage 5 incorporating all the other timing and control components of memory 1; an output buffer stage 6; a third-level circuit 7; and three contact pads 8, 9, 10.

Characterization circuit 2 presents a first input 13 connected to and supplied by third-level circuit 7 with a voltage level TLEV (for enabling the characterization step); a second input 14 supplied with signal OE (for controlling the characterization step); a third, fourth and fifth input 15, 16, 17 connected to and supplied respectively by logic stage 5 with signal ATD (indicating address transition at the start of the read step), signal CE (for enabling circuit 2), and RES (for resetting at the end of the read step); and an output 18 connected to logic stage 5 and supplying a precharge signal PCn.

Third-level circuit 7 (of a known type) comprises a number of diode-connected transistors 20 in series between contact pad 8 and a node 21 grounded via an NMOS transistor 22 having a gate terminal connected to supply line 23 at $V_{DD}$. Node 21 is also connected to input 13 of characterization circuit 2 via two inverters 24, 25 cascade connected to each other, so that, when a high voltage (e.g., of 8 to 12 V) is applied to pad 8, input 13 presents a third-level voltage (greater than $V_{DD}$).

Pad 9 (supplied externally with signal OEn) is connected to the input of an inverter 27, the output of which is connected both to input 14 of characterization circuit 2 and to one input of output buffer stage 6. Output buffer stage 6 also has an input connected to memory array 3, and an output connected to pad 10, so as to receive the data read by memory array 3 and supply it externally of device 1 to pad 10 when enabled by signal OE, which provides for enabling/disabling output buffer stage 6 independently of the internal timing.

FIG. 1 also shows the connection between the output 18 of circuit 2 and memory array 3, for supplying memory array 3 with signal PCn. It also shows the connection between logic stage 5 and memory array 3, for supplying memory array 3 with an equalizing signal EQ used in known manner for reading memory cells 4.

Figure 2:
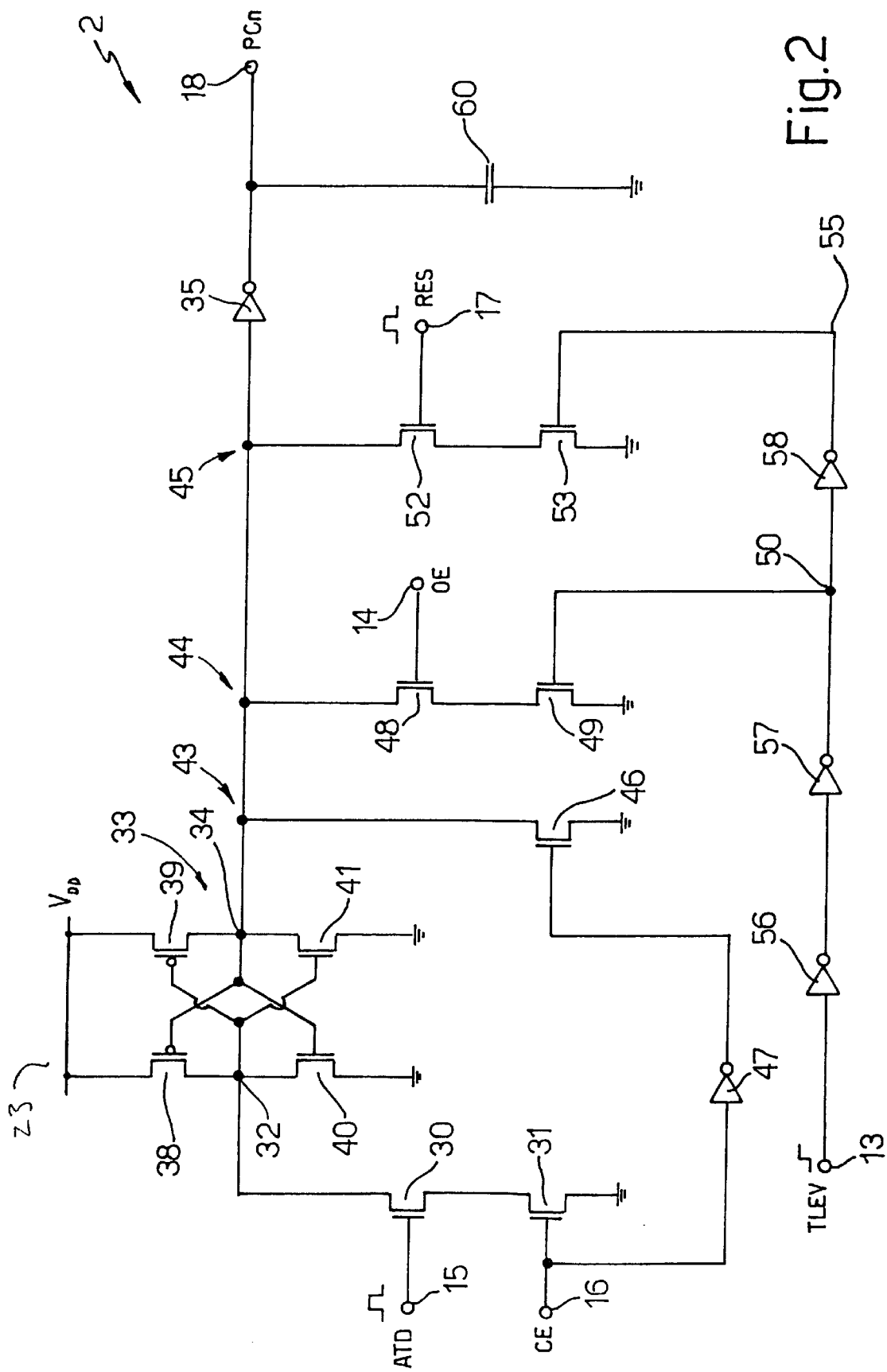
FIG. 2 shows the schematic diagram of the characterization circuit according to the present invention.

With reference to FIG. 2, inputs 15 and 16 are connected to respective gate terminals of two NMOS transistors 30, 31. Transistor 31 has the source terminal grounded, and the drain terminal connected to the source terminal of transistor 30. Transistor 30 has the drain terminal connected to the input node 32 of a latch 33 presenting an output node 34 connected via an inverter 35 to output 18.

Latch 33 comprises two PMOS transistors 38, 39, and two NMOS transistors 40, 41. More specifically, PMOS transistors 38 and 39 have their source terminals connected to supply line 23 at $V_{DD}$, their gate terminals connected respectively to output node 34 and input node 32, and their drain terminals connected respectively to input node 32 and output node 34. NMOS transistors 40 and 41 have their source terminals grounded, their gate terminals connected respectively to output node 34 and input node 32, and their drain terminals connected respectively to input node 32 and output node 34.

The output node 34 of latch 33 is grounded via three reset branches 43, 44, 45. More specifically, reset branch 43 comprises an NMOS transistor 46 having the drain terminal connected to output node 34 of latch 33, the gate terminal connected to input 16 of circuit 2 via an inverter 47, and the source terminal grounded. Reset branch 44 comprises two NMOS transistors 48 and 49. Transistor 48 has the drain terminal connected to output node 34 of latch 33, the gate terminal connected to input 14 of circuit 2, and the source terminal connected to the drain terminal of transistor 49. Transistor 49 has the gate terminal connected to a node 50, and the source terminal grounded. Reset branch 45 comprises two NMOS transistors 52, 53. Transistor 52 has the drain terminal connected to output node 34 of latch 33, the gate terminal connected to input 17 of circuit 2, and the source terminal connected to the drain terminal of transistor 53. Transistor 53 has the gate terminal connected to a node 55, and the source terminal grounded.

Three inverters 56, 57, 58 are cascade connected between input 13 of circuit 2 and node 55. The output of inverter 57, between inverters 56 and 58, forms node 50.

Finally, a capacitor 60 is connected between output 18 of circuit 2 and ground.

Figure 3:
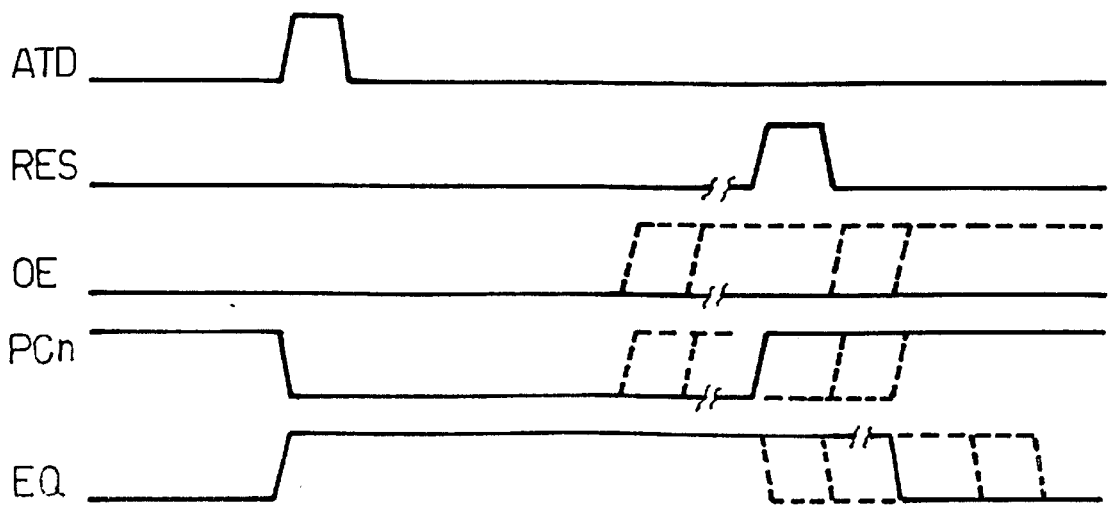
FIG. 3 shows a voltage-time plot of several nodes shown in the FIG. 2 diagram.

With reference also to FIG. 3, circuit 2 in FIG. 1 operates as follows. Assume, in the beginning that signal TLEV at input 13 and signal OE are low, and that enabling signal CE is high. In this condition, with signal RES low and pending the arrival of signal ATD indicating an address transition and enabling of a read step in device 1, transistor 46 is off, node 50 is low, transistor 49 is off, node 55 is high, transistor 53 is on, and transistor 52 is off. Consequently, reset branches 43–45 are all disabled, transistor 31 is on, and transistor 30 is off, so that latch 33 maintains its former condition wherein input 32 is high, output node 34 is low, and output signal PCn is high.

Upon signal ATD switching to high, transistor 30 is turned on and grounds input 32 of latch 33, output 34 switches to high (FIG. 3), and, at the same time, logic stage 5, receiving signal PCn, switches signal EQ to high.

The known circuit generating signal EQ is not shown. Signal EQ may, for example, be generated quite simply from signal PCn by means of asymmetric inverters, i.e., presenting different switching times depending on the switching edge at the input, so that signal EQ switches to high when PCn switches to low, and switches to low with a predetermined delay in relation to low-to-high switching of PCn.

At the end of the precharge step (to commence evaluation of the memorized data item), logic stage 5 generates a pulse in signal RES in known manner. This pulse turns on transistor 52, enables reset branch 45, grounds output node 34, and switches latch 33, so that input node 32 switches to high. This causes signal PCn to switch back to high, and signal EQ also switches (continuous line plots in FIG. 3).

According to FIG. 2, the above succession of events may be modified to characterize the timing circuits of device 1 by means of a third-level signal TLEV (or appropriate code) for disabling reset branch 45 and enabling reset branch 44, which is controllable externally by signal OEn supplied to pad 9 (FIG. 1).

In fact, a high voltage at pad 8 (FIG. 1) switches signal TLEV and node 50 to high, and node 55 to low, so that branch 44 is enabled (even though it remains off, in the absence of signal OE), and branch 45 is disabled (transistor 53 off). On receiving signal ATD, therefore, circuit 2 initially functions as described above, with latch 33 switching and PCn switching to low. In this case, however, the switching of signal RES is ineffective, and the reset condition and the switching of PCn and EQ are now controlled by OE, supplied externally, so as to shorten or lengthen the active state duration of signals PCn and EQ as shown by the dotted lines in FIG. 3.

Therefore, by commencing normal read cycles with a high external OEn signal and switching it to low at different instants in successive cycles, it is possible to obtain different durations of signals PCn and EQ and observe the read characteristics. That is, by evaluating, externally by means of appropriate test algorithms, the data read by memory array 3 and supplied externally by output buffer 6 (also enabled by signal OE—FIG. 1), it is possible to characterize the response of the internal circuits of device 1 to different PCn and EQ intervals. By evaluating the data for intervals of different durations, it is possible to determine the best interval for effectively performing all the readings with no useless delays. The findings may then be used to modify and regulate the internal circuits of stage 5 to generate, among other things, the instant at which the RES signal is switched, and the disabling switch delay of signal EQ. For example, the characterizations so obtained may be used to regulate the timing circuit described in EP-A-O 668 592, for switching the memory elements governing fast or slow read timing conditions.

The same mode may also be applied for investigation purposes, for determining any discrepancy between process parameters and nominal values (e.g., resistance of propagation lines, increase in parasitic capacitance, characteristics of the device 1 components and stages). This may also be used for characterizing the functionality, criticality and limitations of the various components and stages of device 1 to determine their marginality and reliability.

The advantages of the circuit described will be clear from the foregoing description. In particular, the circuit and method described provide for perfecting the succession of read events of a memory device on the basis of real performance and contingent local situations by providing for flexible timing easily controlled externally. The circuit and method represent a convenient means of investigation and characterizing propagation in the event of malfunctioning, and the circuit itself is straightforward, easy to integrate, compact and reliable.

Clearly, changes may be made to the circuit and method as described and illustrated herein without departing from the scope of the present invention. In particular, the characterization step may be enabled by means of an appropriate code or signal, instead of a third level, as described.

It is claimed:

1. A timing characterization circuit for a memory device, comprising an enabling input for receiving an enabling signal; a reset input for receiving a reset signal; an output; and timing source means connected to said enabling and reset inputs and to said output, and in turn comprising a first reset circuit for generating an operating step enabling signal; said operating step enabling signal presenting a first switching edge on receiving said enabling signal, and a second switching edge on receiving said reset signal; a control input receiving an external timing control signal; and a second reset circuit connected to said control input and determining a third switching edge of said operating step enabling signal on receiving said external timing control signal.

2. The circuit of claim 1, further comprising: a second control input receiving a timing mode signal; and a disabling means controlled by said timing mode signal and connected to said first and second reset circuits to selectively and alternately disable said first and second reset circuits.

3. The circuit of claim 2 wherein a voltage level of said timing mode signal differs from the voltage levels of the other signals.

4. The circuit of claim 2 wherein said timing mode signal comprises a coded signal.

5. The circuit of claim 1 wherein said timing source means comprises a memory element connected between a first and a second line at a first and a second reference potential respectively, and having an input connected to said enabling input, and a second output connected to said output of said characterization circuit, said memory element coupling said second output to said first reference potential on receiving said enabling signal; and said first and second reset circuits are connected to and bring said second output to said second reference potential on receiving said reset signal and said external timing control signal respectively.

6. The circuit of claim 5 wherein said memory element is a latch; and in that said first and second reset circuits each comprise controlled switching means interposed between said second output and said second reference potential line; said switching means respectively receiving said reset signal and said external timing control signal.

7. A memory device comprising a data output; a memory array; timing means for generating operating step control signals and connected to said memory array; output means connected between said memory array and said data output; and a timing characterization circuit for a memory device, comprising an enabling input for receiving an enabling signal; a reset input for receiving a reset signal; an output; and timing source means connected to said enabling and reset inputs and to said output, and in turn comprising a first reset circuit for generating an operating step enabling signal; said operating step enabling signal presenting a first switching edge on receiving said enabling signal, and a second switching edge on receiving said reset signal; a control input receiving an external timing control signal; and a second reset circuit connected to said control input and determining a third switching edge of said operating step enabling signal on receiving said external timing control signal.

8. The memory device of claim 7, further comprising: a characterization control input receiving an external characterization control signal and connected to said first and second reset circuits for selective enabling thereof; and a characterization control input receiving said external timing control signal and connected to said second reset circuit and to said output means.

9. A timing characterization method for a memory device, comprising the steps of: generating first switching edges of first and second operating step enabling signals of said memory device; generating a reset signal; enabling a set of first reset circuits which determine second switching edges of said first and second operating step enabling signals on receiving said reset signal; generating an external timing control signal with a predetermined delay in relation to said first switching edges; and enabling second reset circuits which determine third switching edges of said first and second operating step enabling signals on receiving said external timing control signals.

10. The method of claim 9 wherein said step of generating an external timing control signal is preceded by the step of disabling said first reset circuits.

11. The method of claim 10, further including the steps of: evaluating said memory device; repeating, with different delays, said disabling step, said step of generating an external timing control signal, and said step of enabling second reset circuits; and determining optimum delay times on the basis of said evaluation step.

12. An adjustable timing circuit for a memory device, comprising:

a timer having an enabling input adapted to receive an enabling signal, a reset input adapted to receive a reset signal, and an output;

a first reset circuit coupled to the timer, the first reset circuit structured to generate a first switching edge in a step enabling signal upon receiving the enabling signal, and structured to generate a second switching edge in the step enabling signal upon receiving the reset signal; and a second reset circuit coupled to the timer and having a control input adapted to receive a second reset signal, the second reset circuit structured to generate a third switching edge in the step enabling signal upon receiving the second reset signal.

13. The timing circuit of claim 12 wherein the second reset circuit further comprises:

circuitry operable to enable the generation of the second switching edge while disabling the generation of the third switching edge; and the circuitry operable to enable the generation of the third switching edge while disabling the generation of the second switching edge.

14. The timing circuit of claim 12 wherein the first reset circuit further comprises a memory element adapted to store a signal of whether a memory cell in the memory device is currently being read or currently being terminated.

15. The timing circuit of claim 14 wherein the memory element is a latch.

\* \* \* \* \*